United States Patent [19]
Ruetz et al.

[11] Patent Number: 5,254,991
[45] Date of Patent: Oct. 19, 1993

[54] METHOD AND APPARATUS FOR DECODING HUFFMAN CODES

[75] Inventors: Peter Ruetz, Redwood City; Po Tong, Fremont, both of Calif.

[73] Assignee: LSI Logic Corporation, Milpitas, Calif.

[21] Appl. No.: 737,959

[22] Filed: Jul. 30, 1991

[51] Int. Cl.$^5$ ............................................. H03M 7/40
[52] U.S. Cl. ...................................... 341/65; 341/67
[58] Field of Search .............................. 341/65, 67, 95

[56] References Cited

U.S. PATENT DOCUMENTS

| | | | |
|---|---|---|---|
| 3,883,847 | 5/1975 | Frank | 341/65 |
| 4,396,906 | 8/1983 | Weaver | 341/65 |
| 4,899,149 | 2/1990 | Kahan | 341/67 |

OTHER PUBLICATIONS

JPEG-9-R6: Working Draft for Development of JPEG CD, 14 Jan. 1991, CD 10918-1 Digital Compression and Coding of Continuous-tone Still Images.

*Primary Examiner*—Marc S. Hoff
*Attorney, Agent, or Firm*—Skjerven, Morrill, MacPherson, Franklin & Friel

[57] ABSTRACT

A structure and a method are provided for fast-decoding a Huffman code using means for recognizing the number of leading 1's in the Huffman codeword up to a predetermined maximum, and means for removing from the Huffman codeword the number of leading 1's recognized. In one embodiment, both JPEG Huffman code AC and DC tables are stored in a random access memory (RAM). In that embodiment, to access the AC code tables, an address is formed by the number of leading 1's recognized and the portion of Huffman code with the number of leading 1's recognized removed. To access the DC code tables, an address is formed by a predetermined code pattern and the Huffman codeword.

12 Claims, 3 Drawing Sheets

METHOD AND APPARATUS FOR DECODING HUFFMAN CODES

FIELD OF THE INVENTION

This invention relates to decoding of Huffman codes, and in particular relates to circuits for decoding Huffman codes.

DESCRIPTION OF RELATED ART

Huffman codes or codewords are space-efficient variable length binary representations of data. An example of Huffman code use is found in the "JPEG Digital Compression and coding of Continuous-tone Still Images, Draft ISO 10918, 1991" by the Joint Picture Expert Group (JPEG) of the ANSI X3L2.8 committee. In Annex C of the above JPEG Document, JPEG specifies a particular way to generate Huffman code tables for use with entropy encoding of still pictures. Various circuits have been developed to decode Huffman codes. In general, these circuits either decode a Huffman code iteratively using sequential logic (i.e. one or two bits at a time, until the last bit of the code is recognized), or in parallel (i.e. decode the entire code in one clock period) using combinatorial logic. The latter method of decoding Huffman codes is known as "fast decoding."

One method in the prior art for fast decoding Huffman codes is illustrated in FIG. 1. As shown in FIG. 1, a circuit 100 is provided with an alignment buffer 101, a content-addressable memory (CAM) 102 and a random access memory (RAM) 103. The alignment buffer 101 receives a set of bits containing at least one Huffman code of length L, which lies anywhere within the W-bit input word ($L \leq W$) on the terminals of bus 104. The width W of the alignment buffer 101's input word is the maximum width for which a Huffman codeword may be received by this circuit 100. Upon receiving the Huffman codeword, the alignment buffer 101 provides an output word at its output bus 105. This output word on bus 105 is the input Huffman codeword shifted such that the first bit of the Huffman code is aligned to be the first bit of the output word on bus 105 from alignment buffer 101. The memory location in CAM 102, which is addressed by the W bits on the bus 105, contains an n-bit address. This n-bit address is then used on bus 106 to address RAM 103. The size of RAM 103 is determined by the number of accepted Huffman codewords, which is between $2^{n-1}$ and $2^n$ in this example, where n is an integer representing the number of bits in each address in RAM 103. The word in RAM 103 corresponding to the n-bit address on bus 106 contains both the length L and the decoded value of the Huffman code. The length L of the Huffman code thus decoded can then be fed back on the bus 107 to the alignment buffer 101 for aligning the next Huffman code contained in the input word on bus 104.

The approach taken by the prior art, e.g. in circuit 100 of FIG. 1, depends on the availability of an efficiently implemented CAM. CAMs are not readily available in some technologies. Without using a CAM, in order to achieve fast decoding, all the bits of a Huffman codeword would have to be used to address a RAM. The size of such a RAM is impractical and enormous.

SUMMARY OF THE INVENTION

A structure and a method are provided for fast-decoding a Huffman code using means for recognizing the number of leading 1's in the Huffman codeword up to a predetermined maximum, and means for removing from the Huffman codeword both the number of leading 1's recognized and detected, and depending upon the number of leading 1's detected, the bit immediately following the leading 1's.

In one embodiment of the present invention, two JPEG Huffman code tables (called "AC" code tables), each containing 162 codewords, are stored in a random access memory (RAM). The longest Huffman codewords in these tables are 16 bits long. The Huffman codewords in each of these table are grouped into 10 classes according to the number of leading 1's in their binary representation. For the first nine classes (classes 0-8), each member of the class has a number of leading 1's in its binary representation equal to the class number. For the last class (class 9), each member of the class has at least 9 leading 1's. In accordance with the present invention, a leading 1's detector and a barrel shifter are provided, respectively, to recognize the leading 1's and to remove both the leading 1's and, if the Huffman code belongs to one of classes 0-8, the bit immediately following the leading 1's. The portion of the Huffman code remaining after the bits are removed provides lower order address bits to address the RAM.

In another embodiment of the present invention, two JPEG Huffman code tables (called "DC" code tables), each containing 12 codewords, are stored in a RAM. The longest Huffman code words are 12 bits long. The Huffman codewords in each of these tables are also grouped into ten classes, including possibly some empty classes. In accordance with the present invention, a leading 1's detector and a barrel shifter are provided, respectively, to recognize the leading 1's and to remove both the leading 1's and, if the Huffman Codeword belongs to one of the classes 0-8, the bit following the leading 1's. The portion of the Huffman code with these bits removed provides lower order address bits to address the RAM.

In another embodiment of the present invention, both AC and DC JPEG Huffman code tables are provided in a RAM. The RAM locations are divided into 11 sections, in which sections 1-10 are provided to store members of classes 1-10 in each AC table. Both DC tables are provided in section 11 of the RAM. Each DC code table is also divided into 10 classes. In addition to the leading 1's detector and the barrel shifter, decoding logic is provided to form an address of a RAM location in accordance with whether an AC table, or a DC table is accessed.

The present invention implements a fast Huffman code decoding without using a content-addressable memory, which may not be readily available in some technologies. Classification of Huffman codes according to the number of leading 1's leads to an efficient implementation in RAM. The size of RAM necessary for such implementation is much less than $2^m$, where m is the maximum length Huffman code. Thus, the present invention is amenable to implementation in an integrated circuit for such application as image processing.

The present invention is better understood upon consideration of the below detailed description and the accompanying drawings.

DETAILED DESCRIPTION OF THE PREFERRED EMBODIMENTS

The present invention is applicable to a class of Huffman codes which can be generated according to the procedure defined in Annex C of "JPEG Digital Compression and Coding of Continuous-tone Still Images Draft ISO 10918, 1991". Annex C of this JPEG document is hereby incorporated by reference in its entirety. In the following description it is understood that the term "Huffman Code" or "Huffman codeword" refers to a Huffman code or Huffman codeword belonging to such class described by the procedure in Annex C of the JPEG document incorporated by reference above.

A circuit in accordance with the present invention decodes a Huffman codeword ("codeword") of up to a predetermined maximum length by first assigning the codeword into one of a number of classes according to the number of leading 1's in the binary representation of the codeword. In general, the codewords of a given maximum length can be assigned an integer class number ranging between 0 and $c-1$, where c is a selected integer less than the given maximum length. The classes $0, 1, 2, \ldots c-2$ respectively contain as members codewords having $0, 1, 2, \ldots, c-2$ leading 1's. Class $c-1$ contains as members codewords having $c-1$ or more leading 1's. Once the class of the codeword is recognized, the leading 1's can be represented by a more compact class number, and are not needed for further decoding of the codeword. The bit immediately following the leading 1's is necessarily '0' in each class, except class $c-1$, where this bit can be either '1' or '0'. Consequently, for classes $0, 1, \ldots, c-2$, this '0' bit following the leading 1's is also not necessary for further decoding of the Huffman codeword. Therefore, the circuit of the present invention derives a "remainder" by removing from the codeword, for the classes $0, 1, \ldots, c-2$, both the leading 1's and the bit immediately following the leading 1's. For the class $c-1$, the remainder is obtained by removing the leading 1's. In each class, the lengths of the remainders vary according to the set of Huffman codewords accepted. However, compact code tables can be achieved using both the class number and the remainder to form an address into a memory system. Because both the detection of leading 1's in the codeword and the memory access using the class number and the remainder can be readily achieved by combinational logic, the present invention also provides fast decoding of the Huffman codeword.

Figure 1:
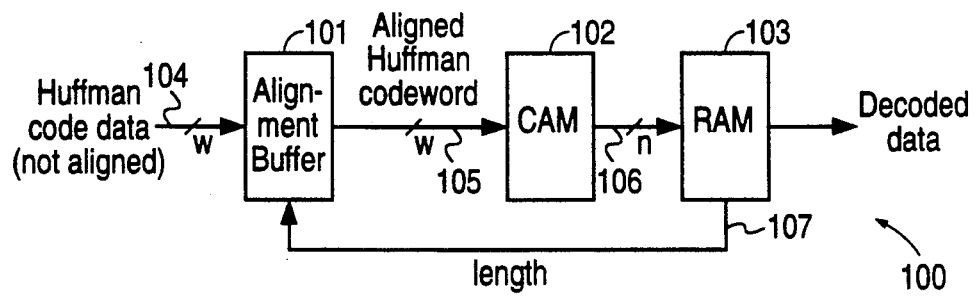
FIG. 1 is a block diagram of a circuit 100 in the prior art for fast decoding a Huffman code word.
Figure 2:
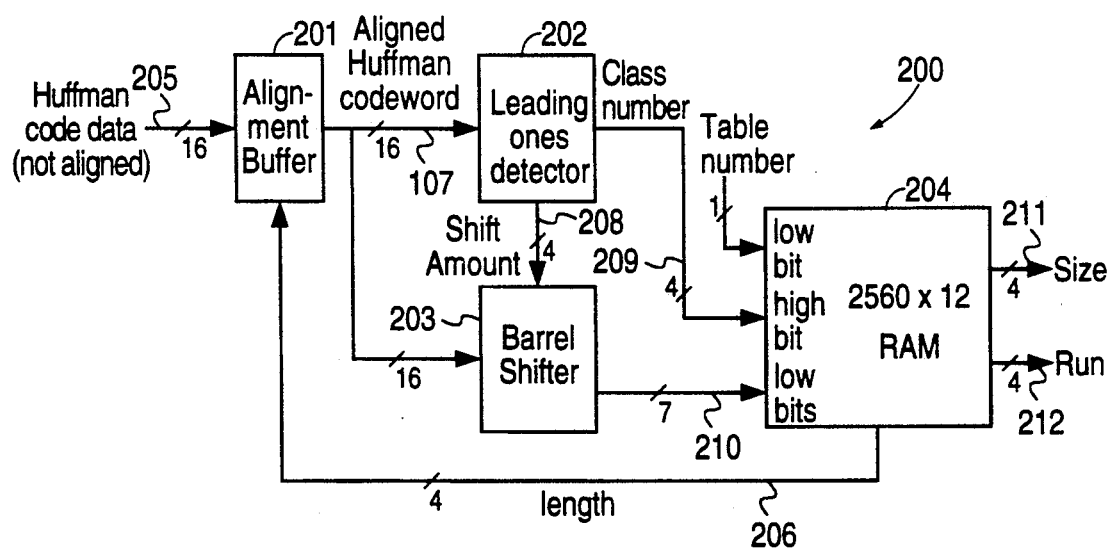
FIG. 2 is a block diagram of a circuit 200 for decoding a JPEG Huffman "AC" codeword, in accordance with the present invention.

FIG. 2 shows an embodiment of the present invention comprising circuit 200 suitable for decoding Huffman codewords in one of two JPEG "AC" code tables. (JPEG defines a coefficient in transform space having a frequency of zero as a "DC" coefficient, and a coefficient in transform space having a non-zero frequency as an "AC" coefficient). Which of the JPEG code tables to use is a matter of choice by the user of circuit 200. Circuit 200 is in fact capable of decoding any Huffman code table of the type defined at the beginning of this detailed description and having 162 or less Huffman codewords, with each codeword being less than or equal to 16 bits. Each JPEG "AC" code table, which is defined in the "JPEG Draft Technical Specification" mentioned above, contains 162 Huffman codewords of less than 16 bits each. One of the two JPEG "AC" code tables, with a possible classification into 10 classes, is provided below in Table 1:

TABLE 1

| Codewords | Class |
|---|---|
| 00<br>010<br>0110<br>01110<br>01111 | Class 0: 0 leading 1's<br>5 codewords |
| 10000<br>10001<br>10010<br>10011<br>10100<br>10101<br>10110<br>10111 | Class 1: 1 leading 1's<br>8 codewords |
| 11000<br>11001<br>11010<br>11011 | Class 2: 2 leading 1's<br>4 codewords |
| 11100<br>11101 | Class 3: 3 leading 1's<br>2 codewords |
| 11110 | Class 4: 4 leading 1's<br>1 codeword |
| 1111100<br>11111010<br>111110110<br>111110111 | Class 5: 5 leading 1's<br>4 codewords |
| 111111000<br>111111001<br>111111010<br>1111110110<br>11111101110<br>111111011110<br>1111110111110<br>11111101111110<br>11111101111111 | Class 6: 6 leading 1's<br>9 codewords |
| 11111110000000<br>11111110000001<br>11111110000010<br>. . .<br>11111110111111 | Class 7: 7 leading 1's<br>64 codewords |
| 111111110000000<br>111111110000001<br>111111110000010<br>. . .<br>111111111011111 | Class 8: 8 leading 1's<br>32 codewords |
| 1111111111100000<br>1111111111100001<br>1111111111100010<br>. . .<br>1111111111111101<br>1111111111111110<br>1111111111111110<br>1111111111111110 | Class 9: at least 9 leading 1's<br>33 codewords |

It can be seen from Table 1 that, for this set of Huffman codewords, the maximum number of binary bits in each class following the leading 1's is no more than 7 bits (e.g. 7 bits in each of classes 6 and 9). In general, it is found that the number n of Huffman codewords and the maximum possible number m of binary bits in the remainder satisfy the relation:

$$2^m + m \leq n \leq 2^{m+1} + m$$

In FIG. 2, an alignment buffer 201 receives on bus 205 a 16-bit word, which includes a Huffman code word of no more than 16 bits long. Alignment buffer 201 aligns the Huffman codeword on bus 207 in accordance with a length specified on 4-bit bus 206, such that the most significant bit on bus 207 is the most significant bit of the Huffman codeword. The length specified on bus 206 is the length of the most recently decoded Huffman codeword and provides positional information used by the alignment buffer 201 to perform the alignment of the current Huffman codeword. Leading 1's detector 202 receives the aligned 16-bit word on bus 207 and provides both a 4-bit class number on bus 209, and a shift amount on 4-bit bus 208. In accordance with Table 1, the class number ranges from 0 to 9. The shift amount, which ranges from 1 to 9, is one more than the class number, except for class 9, which is shifted by 9 bits.

Barrel shifter 203 receives the 16-bit Huffman codeword on bus 207 and provides a 7-bit output value on bus 210. This 7-bit output value on bus 210 is the remainder of the 16-bit Huffman codeword on bus 207. The remainder is obtained by a shifting operation in accordance with the shift amount specified in 4-bit bus 208. A 2560×12 random access memory (RAM) 204 is accessed using an address formed by the class number, the 7-bit output value on bus 210 and a table number. Because there are two JPEG Huffman code tables, the table number is specified by 1 bit. In this embodiment, the table number is either 0 or 1 to distinguish between the two possible JPEG AC code tables. The decoded value of the Huffman codeword is provided by RAM 204 as two 4-bit values on busses 211 and 212, being respectively a 4-bit "size" code and a 4-bit "run length" used in JPEG entropy encoding. The remaining 4 bits in a memory word of RAM 204 provides the length of the Huffman code decoded. This length is output on 4-bit bus 206 to be fed back to the alignment buffer 201 to align the next Huffman codeword. Alignment buffer 201, leading 1's detector 202, barrel shifter 203 and RAM 204 can be implemented by any conventional or suitable circuits known in the art.

Because circuit 200 of FIG. 2 does not use a content-addressable memory (CAM), and because, for each code table, only 11 bits (instead of the full 16 bits of a Huffman codeword) are used to address the RAM memory, circuit 200 of FIG. 2 uses a RAM potentially only 1/32 of the size of a RAM addressed directly by the 16-bit Huffman codeword. Since the number of classes (i.e. 10) in this embodiment is not close to the next higher power of 2 (i.e. 16), a space-efficient RAM addressing scheme to access RAM 204 requires both the table number and the remainder be used as the lower order address bits, and the class number to form the higher order address bits. Space-efficiency is maximized because the RAM space accessed by the values 11-15 in the four higher order address bits need not be implemented.

Figure 3:
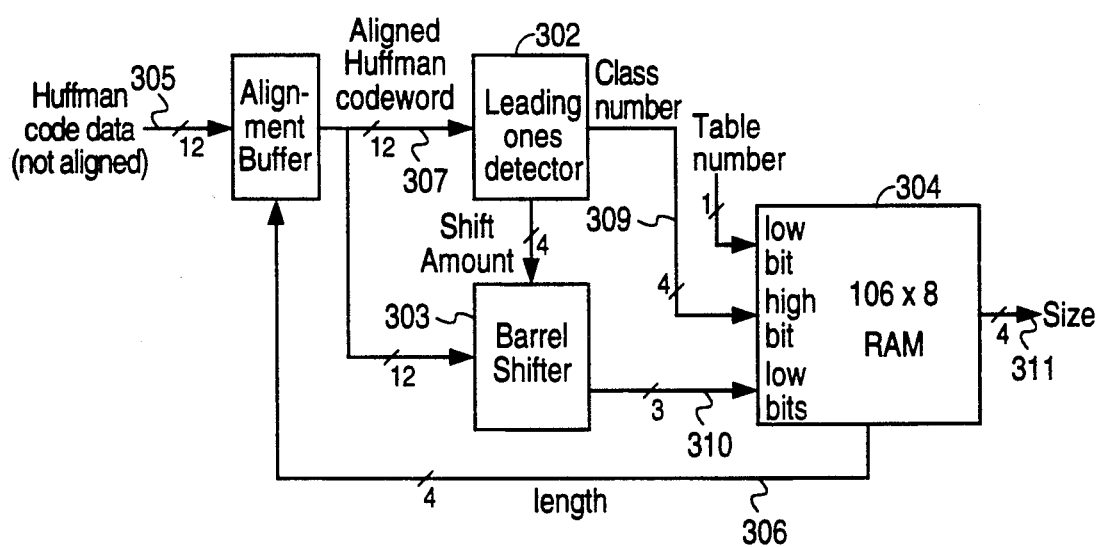
FIG. 3 is a block diagram of a circuit 300 for decoding a JPEG Huffman "DC" codeword, in accordance with the present invention.

An analogous scheme, illustrated by circuit 300 of FIG. 3, can be used to implement decoding for two JPEG "DC" tables. Each JPEG "DC" code table contains 12 Huffman codewords of no more than 12 bits each. Two possible DC code tables A and B are shown in Table 2 below:

TABLE 2

| | |
|---|---|
| Example A: | |
| 00 | Class 0: 0 leading 1's |
| 010 | 4 codewords |
| 0110 | |
| 0111 | |
| 1000 | Class 1: 1 leading 1's |
| 1001 | 4 codewords |
| 1010 | |
| 1011 | |
| 1100 | Class 2: 2 leading 1's |
| 1101 | 2 codewords |
| 1110 | Class 3: 3 leading 1's |
| | 1 codeword |
| 11110 | Class 4: 4 leading 1's |
| | 1 codeword |
| | Class 5: 5 leading 1's |
| | empty |
| | Class 6: 6 leading 1's |
| | empty |
| | Class 7: 7 leading 1's |
| | empty |
| | Class 8: 8 leading 1's |
| | empty |
| | Class 9: at least 9 leading 1's |
| | empty |
| Example B: | |
| 0 | Class 0: 0 leading 1's |
| | 1 codeword |
| 10 | Class 1: 1 leading 1's |
| | 1 codeword |
| 110 | Class 2: 2 leading 1's |
| | 1 codeword |
| 1110 | Class 3: 3 leading 1's |
| | 1 codeword |
| 11110 | Class 4: 4 leading 1's |
| | 1 codeword |
| 111110 | Class 5: 5 leading 1's |
| | 1 codeword |
| 1111110 | Class 6: 6 leading 1's |
| | 1 codeword |
| 11111110 | Class 7: 7 leading 1's |
| | 1 codeword |
| 111111110 | Class 8: 8 leading 1's |
| | 1 codeword |
| 1111111110 | Class 9: at least 9 leading 1's |
| 11111111110 | 3 codewords |
| 111111111110 | |

Circuit 300 of FIG. 3 is similar to circuit 200 of FIG. 2 in many respects, except that the maximum length of the input Huffman codeword is 12 bits rather than 16 bits for the circuit 200. Consequently, the width of bus 307 is also 12 bits. 12-bit alignment buffer 301, 12-bit leading 1's detector 302, 12-bit barrel shifter 303, except for their respective data widths, perform functions identical to those performed, respectively, by 16-bit alignment buffer 201, 16-bit leading 1's detector 202, and 16-bit barrel shifter 203 of FIG. 2. Because there are only 12 codewords in each JPEG DC code table, the remainder is no more than 3 bits, hence the width of bus 310 is 3 bits. Consequently, an 8-bit address is formed by combining the class number (bus 309), the table number and the remainder. RAM 304 can therefore be implemented by a 160×8 memory array. The output values of RAM 304 is a 4-bit size coefficient on bus 311 and a 4-bit length of the Huffman codeword decoded. This 4-bit length is fed back to the alignment buffer 301 on bus 306.

Figure 4:
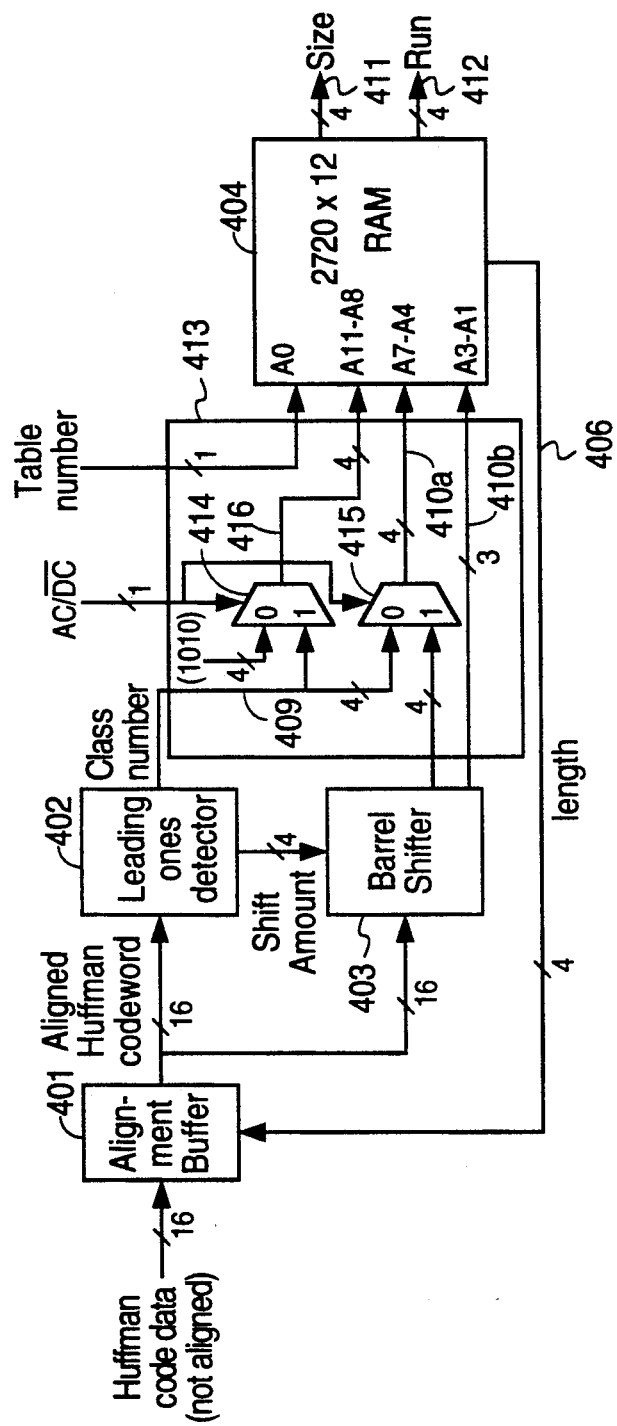
FIG. 4 is a block diagram of a circuit 400 for decoding both JPEG Huffman AC and DC codewords, in accordance with the present invention.

The circuits 200 and 300 of FIGS. 2 and 3 can be combined to implement a decoding circuit for the Huffman codes in both sets of JPEG "AC" and "DC" code tables. This is achieved by circuit 400 of FIG. 4. Shown in FIG. 4 are alignment buffer 401, leading 1's detector 402, and barrel shifter 403, which are respectively similar to the alignment buffer 201, leading 1's detector 202, and barrel shifter 203 shown in FIG. 2. In FIG. 4, however, a structure 413 comprising multiplexers 414 and 415 is used to select between the AC and DC code tables in accordance with the signal AC/DC. When an AC code table is selected, the class number provided on 4-bit bus 409 is selected by multiplexer 414 and output on 4-bit bus 416 as the A11–A8 address lines into RAM 404. At the same time, the multiplexer 415 provides the four least significant bits of the barrel shifter 403's output value on bus 410a. Together with the three most significant bits of the barrel shifter 403's output value on bus 410b, the four bits on bus 410a form a 7-bit remainder similar to the 7-bit remainder on bus 210 of FIG. 2. These 7-bits form the address bits A7—A1 into RAM 404. Therefore, when an AC table is accessed, the table number (address bit A0), the 4-bit class number (address bits A11–A8), and the 7-bit remainder (address bits A11–A8) form the 12-bit address A11–A0 into RAM 404.

In the embodiment shown in FIG. 4, when a DC code table is accessed, multiplexer 414 provides on 4-bit bus 416 the bit pattern '1010', which is used as address bits A11–A8. By providing this bit pattern on bus 416, it is as though the DC code tables contain Huffman codewords belonging to a class having class number "10". The actual 4-bit class number on bus 409 is, however, provided on bus 419a by multiplexer 415 and used as the address bits A7-A4. In the case of the DC code tables, the 3-bit remainder, which is similar to the 3-bit remainder provided on bus 310 of FIG. 3, is provided on bus 410a. Hence, in FIG. 4, to access the DC code tables, the table number (address bit A0), the bit pattern '1010' (address bits A11–A8), the 4-bit class number (address bits A7–A4), and the 3-bit remainder (A3–A1) form the 12-bit, address A11–A0 into RAM 404. It will be appreciated therefore, that RAM 404 can be implemented by a 2720×12 RAM array, which has total addressable locations equal to the sum of the addressable locations in RAMs 204 and 304. Thus, in the embodiment shown in FIG. 4, the four JPEG AC and DC code tables are implemented.

The above detailed description is provided to illustrate the specific embodiments provided above, and not intended to be limiting the present invention. Many modifications and variations within the scope of the present invention are possible. For example, substituting the random access memories used in the embodiments above by programmable logic arrays, or other storage or logic devices, is considered within the scope of the present invention. The present invention is defined by the following Claims.

We claim:

1. A structure for decoding a Huffman codeword, said Huffman codeword having a length no longer than w bits, said structure comprising:
   a leading 1's detector for detecting a number c of leading 1's in said Huffman codeword up to a predetermined maximum no more than w;
   a logic circuit receiving said number c and said Huffman codeword for providing a word of up to m bits, said word being said Huffman codeword remaining after removing, for said number c less than said predetermined maximum, c+1 bits, and for said number c equal to said predetermined maximum, c bits;
   means, having $w*2^m$ locations, for storing decoded values of Huffman codewords; and
   means for forming an address comprising first and second fields being respectively said number c and said m-bit word; and
   means for mapping said address to a location in said storage means.

2. A structure as in claim 1, wherein said logic circuit comprises a barrel shifter.

3. A structure as in claim 1, wherein said storing means comprises a random access memory.

4. A structure as in claim 3, wherein said means for mapping comprises an address decoder for said random access memory.

5. A structure as in claim 4, wherein said second field forms the lower order address bits of said random access memory.

6. A structure as in claim 1, wherein said means for storing contains a plurality of tables holding decoded values of Huffman codewords, said means for storing further receives a signal indicating which one of said tables is in use.

7. A method for decoding a Huffman codeword, said Huffman codeword having a length no longer than w bits, said method comprising the steps of:
   using a leading 1's detector to detect a number c of leading 1's in said Huffman codeword up to a predetermined maximum no more than w;
   providing a logic circuit for outputting a word of up to m bits, said word being said Huffman codeword remaining after removing, for said number c less than said predetermined maximum, c+1 bits, and for said number c equal to said predetermined maximum, c bits;
   providing means, having $w*2^m$ locations, for storing decoded values of Huffman codewords; and
   forming an address comprising first and second fields being respectively said number c and said m-bit word; and
   mapping said address to a location in said storage means.

8. A method as in claim 7, wherein said step of providing a logic circuit comprises the step of using a barrel shifter.

9. A method as in claim 7, wherein said step of providing means for storing comprises the step of using a random access memory.

10. A method as in claim 9, wherein said step of mapping comprises the step of decoding said address for said random access memory.

11. A method as in claim 10, wherein the bits in said m-bit words form the lower order address bits for accessing said random access memory.

12. A method as in claim 7, wherein said means for storing contains a plurality of tables holding decoded values of Huffman codewords, said step of providing means for storing comprising the step of receiving a signal indicating which one of said tables is in use.

* * * * *